(12) United States Patent
Despont et al.

(10) Patent No.: US 9,276,578 B2
(45) Date of Patent: Mar. 1, 2016

(54) NANO-ELECTRO-MECHANICAL-SWITCH ADIABATIC DYNAMIC LOGIC CIRCUITS

(71) Applicant: International Business Machines Corporation, Armonk, NY (US)

(72) Inventors: Michel Despont, Neuchâtel (CH);
Daniel Grogg, Rueschlikon (CH);
Christoph Hagleitner, Rueschlikon (CH); Yu Pu, Eindhoven (NL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/010,195

(22) Filed: Aug. 26, 2013

(65) Prior Publication Data

US 2014/0062532 A1    Mar. 6, 2014

(30) Foreign Application Priority Data

Aug. 31, 2012   (GB) .................................. 1215513.1

(51) Int. Cl.
*H03K 19/02*    (2006.01)
*H03K 19/20*    (2006.01)

(52) U.S. Cl.
CPC ................ *H03K 19/02* (2013.01); *H03K 19/20* (2013.01)

(58) Field of Classification Search
CPC ....... H01H 1/0094; H01H 1/00; H01H 59/00; H03K 19/0016; H03K 19/0019; H03K 19/02; H03K 19/20; H03K 19/00338; H03K 19/00; H01B 13/00; H01P 1/10

USPC .......... 326/104, 112; 977/732, 936, 938, 943; 200/181, 244, 253.1, 600
See application file for complete search history.

(56) References Cited

U.S. PATENT DOCUMENTS

| | | | | |
|---|---|---|---|---|
| 5,473,270 A | * | 12/1995 | Denker | ............................ 326/95 |
| 5,477,164 A | * | 12/1995 | Denker | ............................ 326/21 |
| 5,506,520 A | * | 4/1996 | Frank et al. | ...................... 326/96 |
| 5,777,491 A | * | 7/1998 | Hwang et al. | .................. 326/113 |
| 5,841,300 A | | 11/1998 | Murabayashi et al. | |
| 6,009,021 A | * | 12/1999 | Kioi | .......................... 365/189.06 |
| 6,046,659 A | * | 4/2000 | Loo et al. | ....................... 333/262 |
| 6,388,252 B1 | | 5/2002 | Takahashi et al. | |
| 6,548,841 B2 | * | 4/2003 | Frazier et al. | .................. 257/254 |
| 6,770,558 B2 | | 8/2004 | Delamarche et al. | |

(Continued)

FOREIGN PATENT DOCUMENTS

| | | |
|---|---|---|
| JP | 2012028056 A | 2/2012 |
| WO | 2007130913 A2 | 11/2007 |
| WO | 2011109149 A2 | 9/2011 |

OTHER PUBLICATIONS

Gupta et al, "NEM Relay Memory Design," Technical Report No. UCB/EECS-2009-83, Electrical Engineering and Computer Sciences, University of California at Berkeley, May 21, 2009.*

(Continued)

*Primary Examiner* — Dylan White
(74) *Attorney, Agent, or Firm* — Cantor Colburn LLP

(57) ABSTRACT

A dynamic logic gate includes a nano-electro-mechanical-switch, preferably a four-terminal-nano-electro-mechanical-switch. The invention further refers to dynamic logic cascade circuits comprising such a dynamic logic gate. In particular, embodiments of the invention concern dynamic logic cascade circuits comprising single or dual rail dynamic logic gates.

11 Claims, 10 Drawing Sheets

(56) References Cited

U.S. PATENT DOCUMENTS

| | | |
|---|---|---|
| 6,949,397 B2 | 9/2005 | Despont et al. |
| 7,355,258 B2* | 4/2008 | Valenzuela et al. ............ 257/415 |
| 7,566,939 B2 | 7/2009 | Despont et al. |
| 7,612,424 B1 | 11/2009 | Espinosa et al. |
| 7,653,985 B1 | 2/2010 | Chang et al. |
| 7,719,318 B1* | 5/2010 | Nordquist et al. ............ 326/104 |
| 7,749,915 B2 | 7/2010 | Drechsler et al. |
| 8,018,308 B2 | 9/2011 | Kwon et al. |
| 8,258,899 B2* | 9/2012 | Feng et al. ....................... 335/78 |
| 2003/0219970 A1 | 11/2003 | Delamarche et al. |
| 2004/0041594 A1 | 3/2004 | Kang et al. |
| 2004/0135219 A1 | 7/2004 | Despont et al. |
| 2005/0230839 A1 | 10/2005 | Despont et al. |
| 2009/0128221 A1* | 5/2009 | Kam et al. ..................... 327/434 |
| 2009/0133914 A1 | 5/2009 | Dellmann et al. |
| 2010/0012471 A1 | 1/2010 | Majumder et al. |
| 2010/0090565 A1 | 4/2010 | Bhaskaran et al. |
| 2010/0140066 A1 | 6/2010 | Feng et al. |
| 2011/0002168 A1* | 1/2011 | Schepens et al. ........ 365/185.08 |
| 2011/0047785 A1 | 3/2011 | Biskeborn et al. |
| 2011/0079495 A1 | 4/2011 | Knipe et al. |
| 2011/0089008 A1 | 4/2011 | Lewis |
| 2013/0127494 A1* | 5/2013 | Liu et al. .......................... 326/40 |
| 2013/0146429 A1* | 6/2013 | Despont et al. ................ 200/181 |
| 2014/0059843 A1* | 3/2014 | Despont et al. .................. 29/622 |
| 2014/0061013 A1* | 3/2014 | Despont et al. ................ 200/181 |
| 2014/0087525 A1 | 3/2014 | Chen et al. |

OTHER PUBLICATIONS

Nathanael et al, "4-Terminal Telay Technology for Complementary Logic," Proc. IEEE Int. Electron Devices Meeting (IEDM), Dec. 7-9, 2009, pp. 223-226.*

International Search Report and Written Opinion; International Application No. PCT/IB2013/056276; International Filing Date: Jul. 31, 2013; Date of Mailing: Dec. 3, 2013; pp. 1-7.

Nathanael et al, "4-terminal relay technology for complementary logic," Proc. IEEE Int. Electron Devices Meeting (IEDM), 2009, pp. 223-226.

GB Intellectual Property Office; Application No. GB1215512.3; Patents Act 1977: Search Report under Section 17(5); Date Mailed: Dec. 11, 2012, pp. 1-3.

GB Intellectual Property Office; Application No. GB1215513.1; Patents Act 1977: Search Report Linder Section 17(5); Date Mailed: Dec. 24, 2012; pp. 1-3.

* cited by examiner

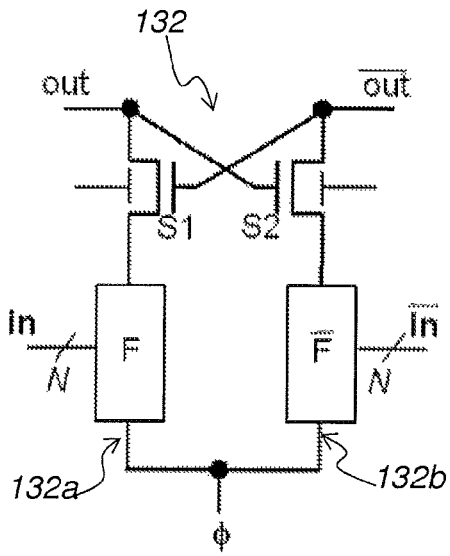
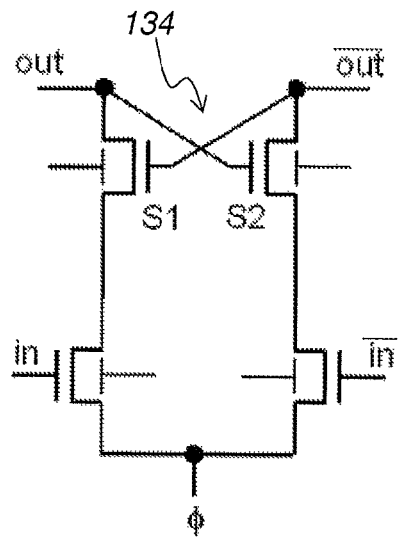
FIG. 9(a)　　　　　　　FIG. 9(b)
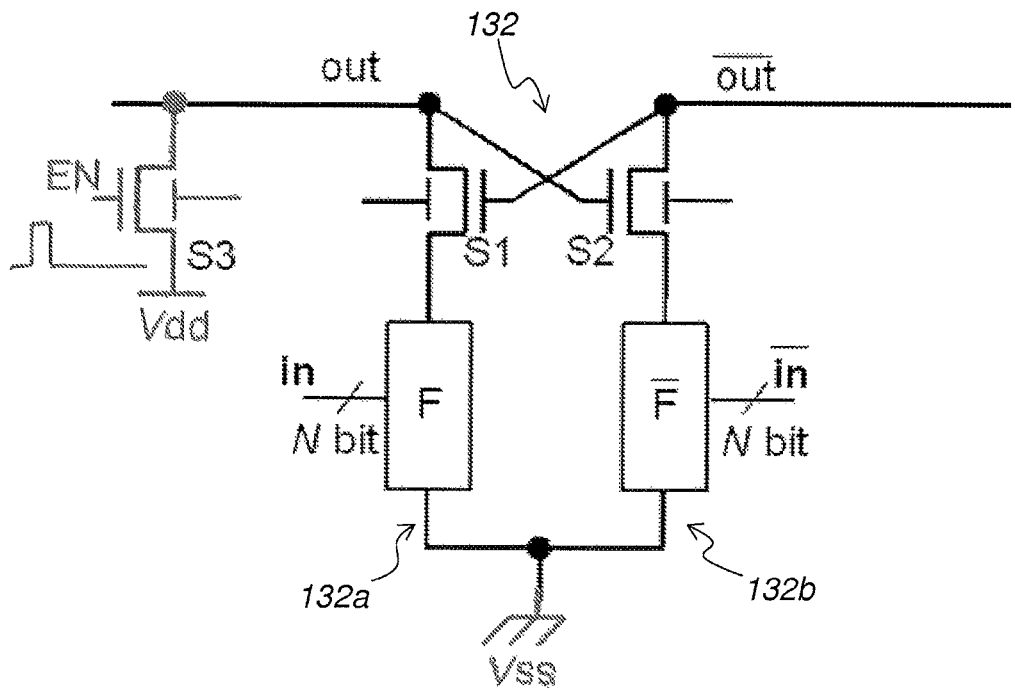
FIG. 10

US 9,276,578 B2

NANO-ELECTRO-MECHANICAL-SWITCH ADIABATIC DYNAMIC LOGIC CIRCUITS

PRIORITY

This application claims priority to Great Britain Patent Application No. 1215513.1, filed Aug. 31, 2012, and all the benefits accruing therefrom under 35 U.S.C. §119, the contents of which in its entirety are herein incorporated by reference.

BACKGROUND

The invention relates to the field of computerized system science, and more specifically, to dynamic logic gates and to dynamic logic cascades comprising such dynamic logic gates.

It is known to use complementary metal oxide semiconductor (CMOS) and silicon on insulator (SOI) for constructing dynamic logic gates. FIG. 1 shows an example of a two input AND dynamic logic gate 10 designed with CMOS/SOI technology. The dynamic logic gate 10 of FIG. 1 comprises: a first CMOS 12 whose gate is connected to a clock signal clk; a second CMOS 14 whose gate is supplied with a first input signal B to be added to a second input signal A, and whose source electrode is connected to the drain electrode of the first CMOS 12; a third CMOS 16 whose gate is supplied with the second input signal A, whose source electrode is connected to the drain electrode of the second CMOS 14, and whose source electrode is connected to the drain electrode of a fourth CMOS 18, wherein the gate of the fourth CMOS 18 is supplied with a complementary clock signal $\overline{\text{clk}}$ (complementary to the clock signal clk).

The drain electrode of the third CMOS 16 is connected to an operational amplifier (also known as inverter) 20 so as to ensure output signal level of the dynamic logic gate 10.

Such dynamic logic gates may be used in microprocessors, microcontrollers and other digital logic circuits.

It is known that a dynamic logic gate as the one illustrated on FIG. 1 suffers from a leakage current (represented by arrow 22) which limits the scaling of CMOS' threshold voltage $V_t$—below which the current through a CMOS drops exponentially—and supply voltage $V_{dd}$. The leakage current thus prevents lowering energy per computing operation. Moreover, this type of dynamic gate is very sensitive to noise.

To limit the leakage current in a dynamic logic gate of the type exemplified in FIG. 1, it is known to add a further keeper (also known as "bleeder") CMOS 24. However, adding a further CMOS device complicates the circuit and goes against miniaturization thereof.

SUMMARY

In one embodiment, a dynamic logic gate includes a nano-electro-mechanical-switch.

BRIEF DESCRIPTION OF THE SEVERAL VIEWS OF THE DRAWINGS

The invention will now be described, by way of non-limiting examples, and in reference to the accompanying drawings, where:

FIGS. 9A and 9B show schematically various examples of dual rail adiabatic dynamic logic gate circuits comprising four terminal nano-electro-mechanical-switch as shown in FIG. 2;

FIG. 10 illustrates the initialization of the circuit of FIG. 9A;

DETAILED DESCRIPTION

Figure 1:
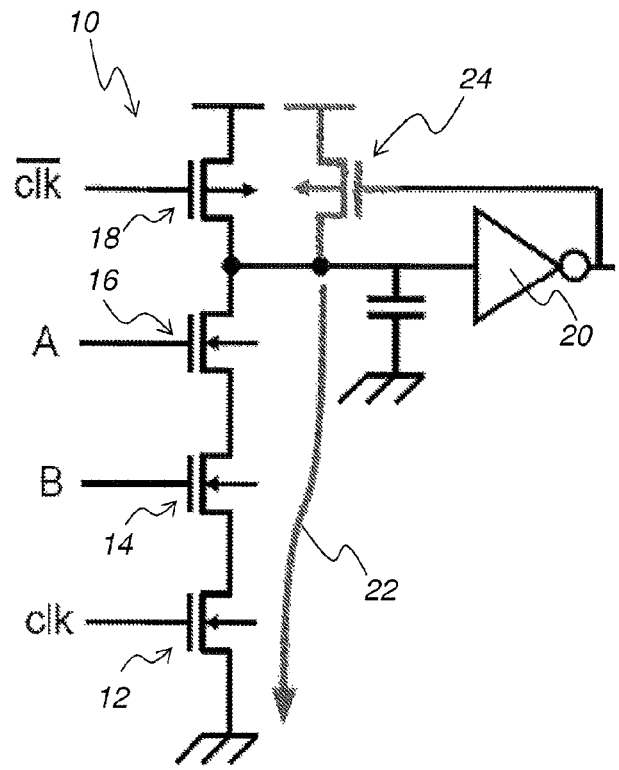
FIG. 1 shows a CMOS type dynamic AND gate with DC power supply.

According to one aspect, the invention is embodied as a dynamic logic gate comprising a nano-electro-mechanical-switch. In embodiments, the invention may be embodied such as to comprise one or more of the following features: the nano-electro-mechanical-switch is a four-terminal-nano-electro-mechanical switch; the nano-electro-mechanical switch comprises a body electrode, a source electrode, a gate electrode, and a drain electrode, the source electrode being selectively electrically connected to the drain electrode, in function of the tension between the gate electrode and the body electrode; the nano-electro-mechanical switch further comprises a cantilever beam adapted to flex in response to an actuation voltage applied between the body electrode and the gate electrode, the cantilever beam comprising the source electrode, the body electrode and an insulating layer, the latter separating the body electrode from the source electrode, the cantilever beam being configured such that, upon flexion of the cantilever beam, the source electrode comes in contact with the drain electrode at a single mechanical contact point at the level of an end of the cantilever beam; the nano-electro-mechanical-switch further comprises a cantilever beam adapted to flex in response to an actuation voltage applied between the body electrode and the gate electrode, the cantilever beam comprising the input electrode, the body electrode and the insulating layer, the latter separating the body electrode from the input electrode, the cantilever beam being configured such that, upon flexion of the cantilever beam, the input electrode comes in contact with the output electrode at a single mechanical contact point at the level of an end of the cantilever beam; the dynamic logic gate further comprises a time-varying power for supplying a timing-varying power clock signal to the nano-electro-mechanical-switch; the time-varying power clock signal is one of a sinusoidal signal and a trapezoidal signal; and the amplitude of the power clock signal is equal to the hysteresis voltage gap of the nano-electro-mechanical-switch plus a predetermined design margin.

According to another aspect, the invention may be embodied as a dynamic logic cascade circuit comprising single-rail dynamic logic gates, the latter comprising at least one logic gate according to embodiments described, wherein the dynamic logic cascade circuit generates a single logic output.

In embodiments, the dynamic logic cascade circuit may comprise four dynamic logic gates coupled to four respective power sources for providing the four dynamic logic gates with respective time-varying power clock signals.

According to still another aspect, the invention may be embodied as a dynamic logic cascade circuit comprising dual-rail dynamic logic gates, the latter comprising at least one logic gate according to embodiments described earlier, wherein the dynamic logic cascade circuit generates a logic output and its complementary output. Next, aspects of the invention concerning a dynamic logic cascade circuit may be embodied such as to comprise one or more of the following features: the dynamic logic cascade circuit comprises two cross-coupled dynamic logic gates for latching output signals; the dynamic logic cascade circuit further comprises a dynamic logic gate for initializing output signals; the dynamic logic cascade circuit comprises four dual-rails dynamic logic gates and four respective power sources for providing the four dual-rails dynamic logic gates with respective time-varying power clock signals; the four power clock signals are out-of-phase by 90 degrees; and each of the four time-varying power clock signals comprises four equal timing intervals, respectively corresponding to pre-charge, hold, evaluate and latch periods.

Aspects of the present invention can be first embodied as a dynamic logic gate, e.g., a dynamic logic gate in adiabatic style or in a CMOS-type style, as described in more detail below.

Of course, in the present case, "logic gate" must be understood as a physical device implementing a Boolean function. In other words, a logic gate is a physical device that performs a logical operation on one or more logic signal inputs and produces a single logic signal output.

A logic gate according to embodiments is a dynamic logic (or "clocked logic") gate which is to distinguish from a static logic gate. In dynamic logic a clock signal is used for the implementation of combinational logic circuits. In other words, the dynamic logic gate is supplied with one clock power signal.

Dynamic logic is faster than a static counterpart, and requires less silicon area. It needs a precharge (or pre-discharge) phase to bring a known state to the signal node. During the evaluation phase the signal node is evaluated to a stable value.

According to embodiments a nano-electro-mechanical-switch (hereafter "NEMS") is used in a dynamic logic gate.

NEMS are for example described in "4-terminal relay technology for complementary logic," R. Nathanael, V. Pott, H. Kam, J. Jeon and T.-J King Liu in IEDM Tech. Dig., December 2009, pp. 223-226. In such a 4-terminal NEMS (hereafter 4T-NEMS), a metallic conducting channel is attached via an insulating gate dielectric to a movable gate electrode. In the off state, an air gap separates the 4T-NEMS. On the contrary, in the on state, electrostatic forces between the gate and the body electrode causes the gate to be deflected (i.e. actuated) to bring the conducting channel into contact with the source and drain electrodes so as to form a conductive path for current to flow.

Figure 13:
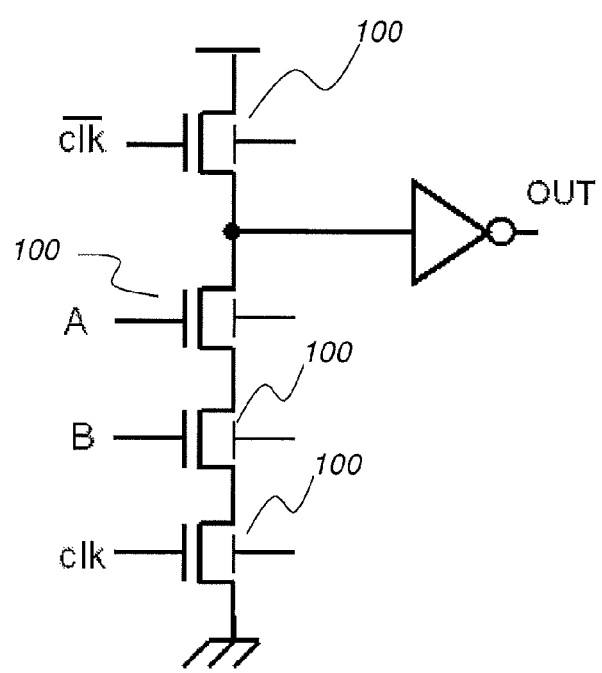
FIG. 13 shows a NEMS type dynamic AND gate with a DC power supply.

Compared with implementing dynamic logic in CMOS/SOI, NEMS dynamic logic has a higher reliability and a lower design complexity because: a NEMS consumes zero leakage current when it is off, so that the precharged signal node can safely retain its electron charges. This removes the overhead from adding keeper transistors as in CMOS/SOI dynamic logic circuits; Note that FIG. 13 shows the implementation of NEMS type dynamic logic gate (2-input AND gate in our example) with a DC power supply. Compared with the CMOS type implementation in FIG. 1, the "bleeder" can be safely removed in that case.

Due to the DC hysteresis of a NEMS, its on/off status is insensitive to noise on its input. A disturbance noise on the output signal of a first dynamic logic gate can hardly affect the status of a following cascaded dynamic logic gate. Therefore, noises such as charge redistribution, cross-talk and ground bound noise, which are particularly critical concerns in CMOS/SOI dynamic logic, have only a marginal impact on NEMS dynamic logic.

The dynamic logic gate according to embodiments of the invention is preferably an adiabatic dynamic logic gate. In contrast to a conventional logic circuit which would charge/discharge a signal node capacitor C abruptly from 0 to $V_{dd}$ (and vice versa), $V_{dd}$ being the amplitude of the power signal, adiabatic logic limits the potential across the resistive components of the gate to be as small as possible during the entire transient time. This may be realized by charging/discharging a signal node capacitor C with a time-varying power signal. A time-varying power signal must be understood as a signal which 1 comprises slopes or more generally continuous variations during at least a quarter of its period. These slopes or continuous variations may be time discontinuous (for example joined by a time interval during which the signal is constant).

The energy dissipated $E_{diss}$ in an ideal adiabatic system during an operation is:

$$E_{diss}=(RC/T)CV_{dd}^2 \qquad \text{(eq. 1)}$$

where:

R is the equivalent resistor corresponding to the resistive components of the circuit, C is the signal node capacitor, T is the period of the time-varying power signal, and $V_{dd}$ is the voltage amplitude of the time-varying power signal.

By allowing that the period of the time-varying power signal T is much bigger than RC, the energy drawn to charge the signal node capacitor C can be returned to the power supply, while the resistive components consume only marginal net losses—the adiabatic energy losses.

Theoretically, adiabatic logic consumes only marginal adiabatic energy losses while the rest of energy can be recovered. However, when realizing adiabatic logic in CMOS/SOI processes, two additional non-adiabatic energy losses occur, i.e., leakage energy loss and the threshold voltage residue charge loss.

These two non-adiabatic losses often dominate the total energy consumption, hence making CMOS/SOI adiabatic logic less appealing. By designing circuit with NEMS, in particular with 4T-NEMS, the proposed NEMS adiabatic dynamic logic (here after "ADL") avoids both the leakage energy loss and the threshold voltage residue charge loss. The suggested NEMS ADL thus only consumes the adiabatic energy loss. As a result, an ultra-low energy loss close to zero energy loss is achieved.

NEMS logic gates may be used to design dynamic logic cascade circuits. Dynamic logic cascades are circuits comprising a plurality of dynamic logic gates connected in such a way that an output signal from one logic gate is the input signal of another logic gate, i.e., the drain electrode from one 4T-NEMS is connected to the gate electrode of another 4T-NEMS.

Figure 2:
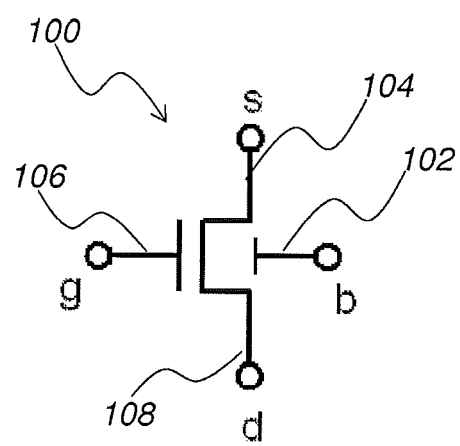
FIG. 2 shows schematically an example of a four terminal nano-electro-mechanical-switch.

Dynamic logic cascade circuits may in particular take the form of: single logic rails, which deliver only one output signal; and dual logic rails, which comprises two symmetrical single logic rails coupled in such a way that they deliver two complementary output signals. FIG. 2 shows an example 100 of a 4T-NEMS with its four terminals or electrodes: a body electrode 102; a source electrode 104; a gate electrode 106; and a drain electrode 108.

In operation of the gate to body tension the source and the drain electrodes are selectively electrically connected.

This may be realized thanks to a cantilever beam adapted to flex in response to an actuation voltage applied between the body electrode and the gate electrode. The cantilever beam may comprise the source electrode, the body electrode and an insulating layer, the latter separating the body electrode from the source electrode. The cantilever beam may be configured such that, upon flexion of the cantilever beam, the source electrode comes in contact with the drain electrode at a single mechanical contact point at the level of an end of the cantilever beam.

Figure 3:
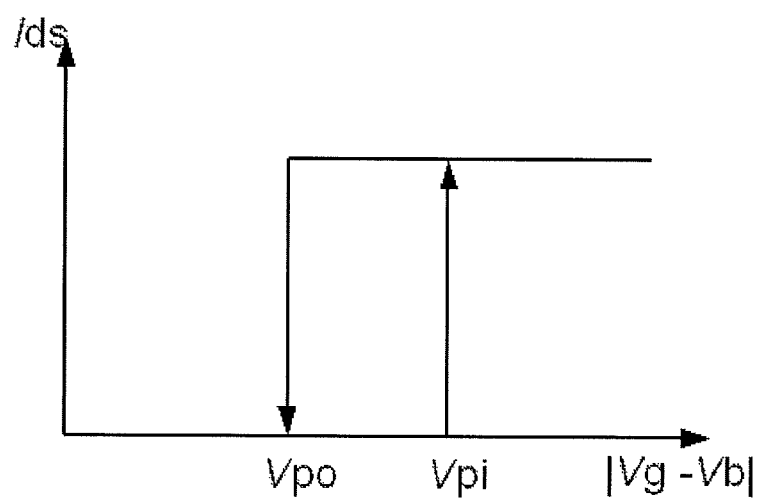
FIG. 3 shows the DC characteristic of the four terminal nano-electro-mechanical-switch of FIG. 2.

The DC characteristic of the 4T-NEMS 100 of FIG. 2 is illustrated in FIG. 3. According to this figure, as the gate-to-body voltage $|V_{gb}|$ increases, no current exists when $|V_{gb}|$ is less than the pull-in voltage $V_{pi}$, because the source and drain electrodes are completely separated by an insulator such as air. When $|V_{gb}|$ gets equal or greater than $V_{pi}$, the conducting channel forms a current flow.

As $|V_{gb}|$ decreases, when $|V_{gb}|$ gets equal to or less than the pull-out voltage $V_{po}$, the restoring force causes the gate electrode to move, separating the source and drain electrodes, so that the device switches off. The hysteresis between $V_{pi}$ and $V_{po}$ is due to surface adhesion force.

It must be noticed that, compared to a 3-Terminal NEMS (hereafter "3T-NEMS") whose on and off are dependent on source voltage, the on and off of a 4-T NEMS are determined only by its gate to body voltage $|V_{gb}|$, independently of the drain or the source voltages. This feature brings a larger flexibility to designing circuits.

Body biasing may be applied to the NEMS, in particular in case the clock power signal is a time varying signal. In this latter case, the input ramps increase from 0 to $V_{dd}$. To ensure that the 0V voltage (i.e., ground voltage) pull-off the NEMS, the body voltage $V_b$ may be biased to $-V_{po}$. To ensure that the $V_{dd}$ level voltage pull-in the NEMS, $V_{dd}$ may be at least $V_p - V_{po}$, i.e., equal to the DC hysteresis gap. In practice $V_{dd}$ may be equal to the DC hysteresis gap plus a predetermined value or safety margin.

Figure 4:
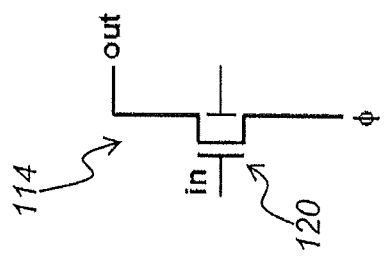
FIGS. 4A, 4B and 4C show schematically various examples of single rail adiabatic dynamic logic gates comprising a four terminal nano-electro-mechanical-switch as shown in FIG. 2.
Figure 4:
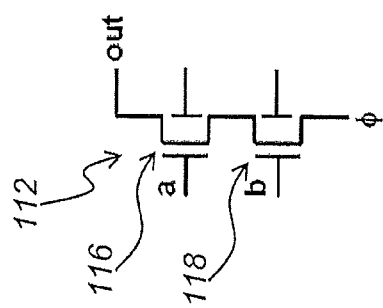
Figure 4:
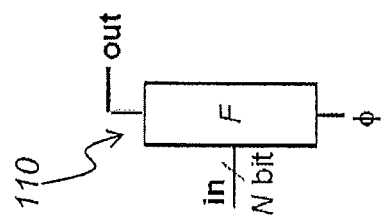

Moreover, the pull-in voltages and the pull-out voltages of each NEMS device in a circuit may not be exactly the same due to process variations. Then the bulk voltage $V_b$ may be biased to $-\min\{V_{po}\}$, where $V_{po}$ is the set of the pull-off voltages of all NEMS in the circuit. The $V_{dd}$ may be $\max\{V_{pi}\} - \min\{V_{po}\}$, where $V_{pi}$ is the set of the pull-in voltages of all NEMS in the circuit. FIG. 4(a) shows a NEMS dynamic logic gate 110 which implements a logic function F. The gate is supplied by a power clock signal $\Phi$, preferably a time-varying power clock signal. The complexity of a NEMS dynamic logic gate is N switches for an N-bit input function. For example, FIG. 4(b) and FIG. 4(c) show a 2-input NAND gate 112 and an inverter gate 114.

For the two-input NAND function, the logic gate consists in two NEMS, the source electrode of a first NEMS 116 being connected to the drain electrode of the second NEMS 118, whose source electrode is supplied with the power clock $\Phi$. The gate electrode of each of the two NEMS 116, 118 is supplied with a respective input signal a or b to be added.

For the one-input inverter function, the logic gate consists in only one NEMS 120 whose gate is supplied with the input signal to be inverted, in, the drain electrode of the NEMS being supplied with the power clock $\Phi$.

Figure 5:
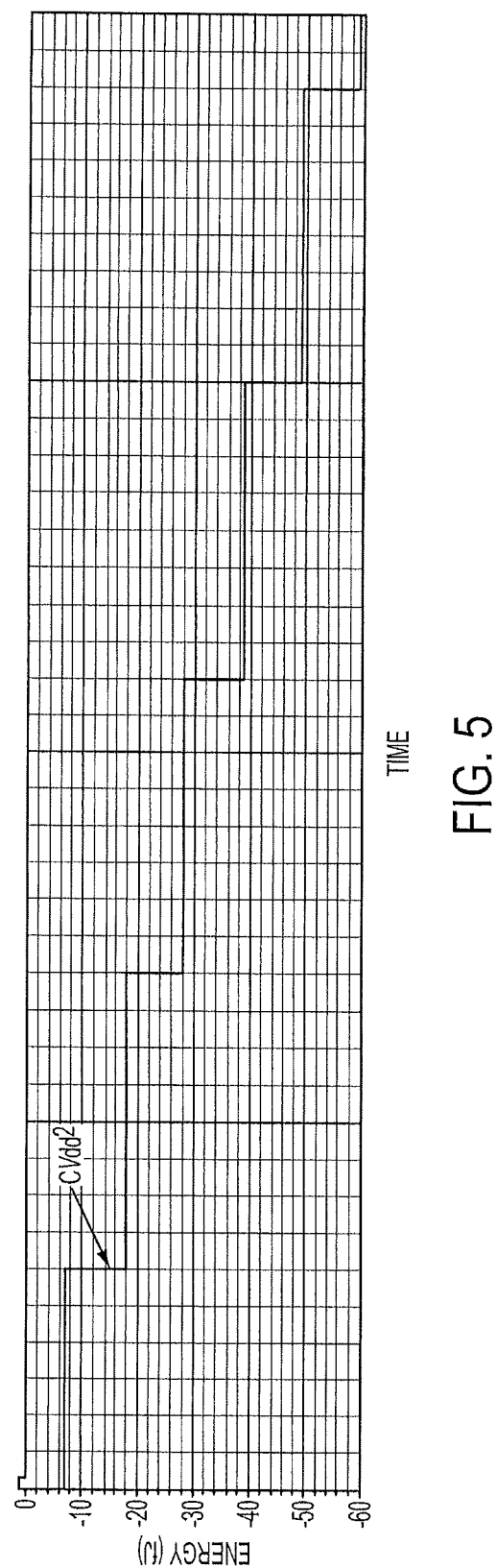
FIG. 5 shows graphically the energy dissipation in a conventional four terminal nano-electro-mechanical-switch logic circuit.

FIG. 5 illustrates the energy dissipation in a NEMS dynamic logic gate 110 of the type of FIG. 4(a) when the clock power signal is of the square-wave form.

The electrostatic force in a NEMS switch is adjusted by changing the electron charges on the node capacitor. The on/off status can thus be controlled. The abrupt input voltage switches from 0 to $V_{dd}$ (and vice versa) during transition results in an abrupt energy loss. When a switch is pulled in and the capacitor is charged from 0 to $V_{dd}$, a charge of $Q=CV_{dd}$ is taken from the power source and the energy withdrawn from the power source is $E=QV_{dd}=CV_{dd}^2$. Unfortunately, only half of the energy $\frac{1}{2}CV_{dd}^2$ is stored on the capacitor, and the other half is dissipated as heat, primarily in the resistor and damper. When the switch is pulled off, the energy stored on the capacitor is also lost as heat in the resistor and damper. As shown in the simulation of FIG. 5, the total energy dissipation steps up (Note that the energy in FIG. 5 is negative because the simulator takes the convention that energy leaving power source is negative and energy entering power source is positive). According to FIG. 5, energy dissipated at each calculation step of in the dynamic logic circuit is, in this case, equal to $CV_{dd}^2$, i.e. the total energy supplied by the power source.

Figure 6:
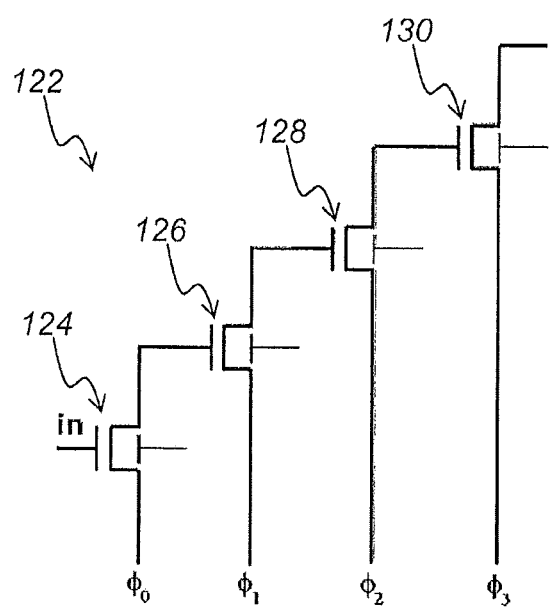
FIG. 6 shows schematically a cascaded four terminal nano-electro-mechanical-switch single rail circuit.

In case that a time-varying input voltage power is applied to actuate the NEMS, the heat dissipation is reduced by controlling the ramping rate from 0 to $V_{dd}$ (or vice versa), as explained above. It is, for example, possible to control the ramping so that the energy dissipation per calculation step is equal to $\frac{1}{2} CV_{dd}^2$, i.e. half the total energy supplied by the power source. FIG. 6 illustrates a cascade circuit 122 of four inverter dynamic logic gates of the type of the logic gate 114 of FIG. 4(c) connected in a single rail. According to FIG. 6, the drain electrodes of the first, second and third 4T-NEMS 124, 126, 128, are respectively connected to the gate electrode of the second, third and fourth 4T-NEMS 126, 128, 130. Each of the four 4T-NEMS 124, 126, 128, 130 is supplied with a respective clock power signal $\Phi_0$, $\Phi_1$, $\Phi_2$, $\Phi_3$. These power clock signals $\Phi_0$, $\Phi_1$, $\Phi_2$, $\Phi_3$ may have a square-wave form or, alternatively, also of other periodical wave-forms such as a sinusoidal wave form.

Figure 7:
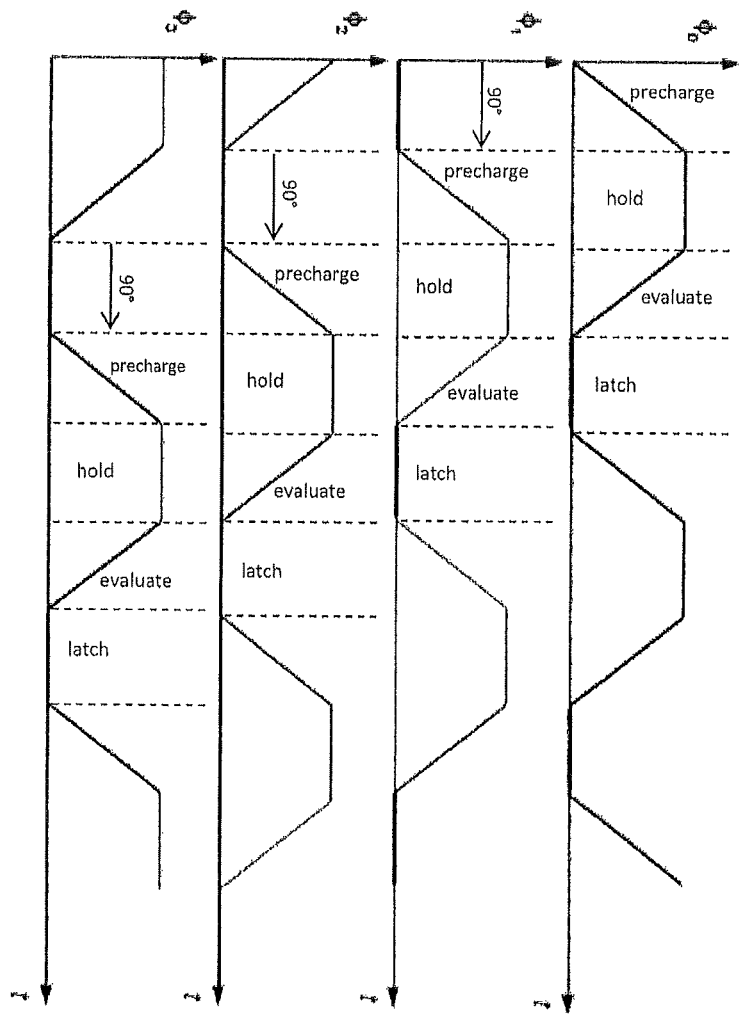
FIG. 7 shows graphically the four phase power clocks associated to the four cascaded four terminal nano-electro-mechanical-switch of FIG. 6.

FIG. 7 illustrates an alternative of four-phase power clock signals $\Phi_0$, $\Phi_1$, $\Phi_2$, $\Phi_3$ which ensures a correct functioning of the cascade circuit 122 of FIG. 6 and enables energy recovery. According to FIG. 7, the power clock signal applied to each NEMS is shifted by 90° (i.e. a quarter of the signal period) with respect to the power clock signal applied to its preceding NEMS. Each power clock signal consists of four interval cycles:

In a precharge interval, the clock power supply ramps from 0 to $V_{dd}$, and the input signal is high, so the output node capacitor of the corresponding NEMS is precharged from 0 to $V_{dd}$. During the hold interval, the power clock signal is kept at $V_{dd}$, and the gate's output node capacitor of the corresponding NEMS remains at $V_{dd}$ voltage. This ensures that the subsequent NEMS (which is in precharge interval) is on so its output node can be precharged. During the evaluation interval, the outputs are evaluated from their stable input signals (which include the output signal from the preceding NEMS which is in latch interval). Energy is recovered in this interval.

A latch interval is finally inserted to: (a) ensure the output data can be sampled; (b) provide a stable signal to the subsequent gate which is in an evaluation interval; and (c) make the power clock symmetric, as symmetric power waves are easier and more efficient to be generated.

It may be noticed that in the NEMS single rail dynamic logic cascade circuit 122, advantage is taken of the DC hysteresis of NEMS: as the first gate begins precharging, it causes the input to the second gate (which is in latch interval) to undergo a low to high transition. However, this will not cause the second gate to change its output until its input voltage reaches the pull-in voltage, so the output data can be sampled correctly.

In the NEMS single rail dynamic logic (here after "SRADL") cascade circuit 122, energy can be recovered when the evaluated output data is zero, i.e., the output capacitor is discharged after evaluation; but if the evaluated output data is one, the energy stored on the output capacitor will be lost as a non-adiabatic loss when precharge interval begins.

Figure 8:
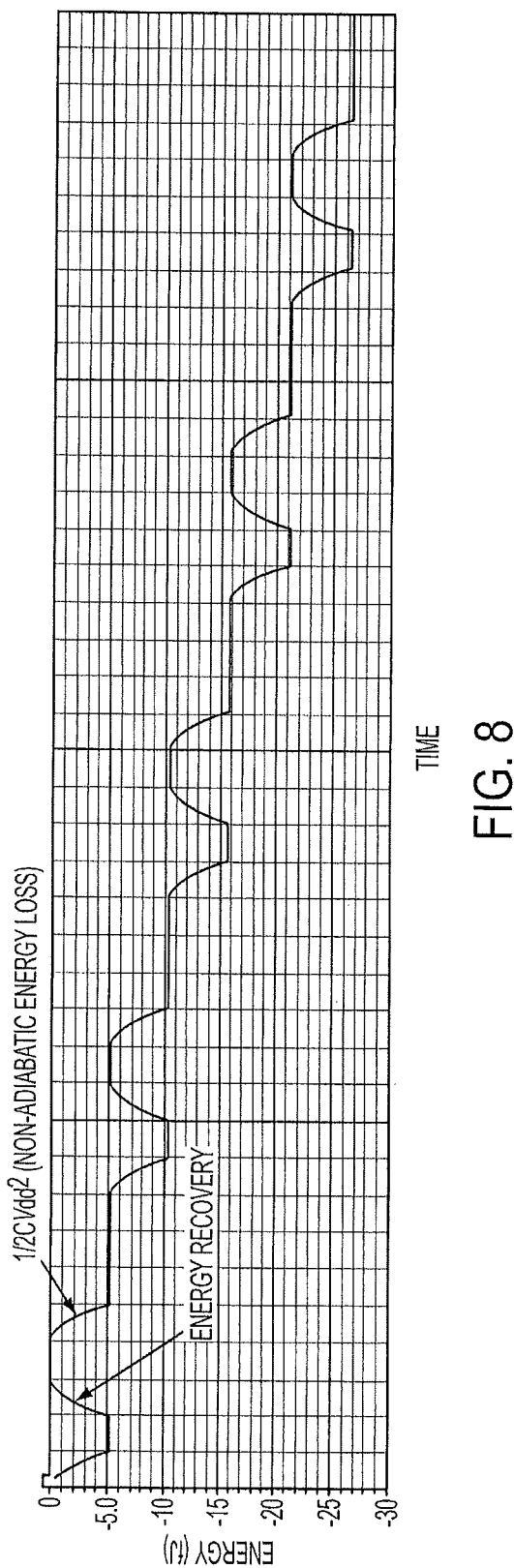
FIG. 8 shows graphically the energy dissipation in the circuit of FIG. 6.

For instance, if the input of the cascaded inverter chain in FIG. 6 is periodically switched, then, as shown in FIG. 8, close to half of the energy can be saved as compared to the conventional logic circuit implementation.

FIG. 9 illustrates NEMS dual-rail adiabatic dynamic logic (here after "DRADL") cascade circuits 132, 134, proposed to overcome the non-adiabatic energy loss in NEMS SRADL cascade circuits. NEMS DRADL cascade circuits, as shown in FIG. 9, are also supplied by a power clock signal Φ. The complexity of NEMS DRADL cascade circuits is 2N+2 switches or NEMS for an N-bit input function. NEMS DRADL cascade circuits generate both an output, out, and its complementary output. FIG. 9(b) shows a NEMS DRADL inverter circuit 134. Note, for completeness, that NEMS type single-rail dynamic logic gate generates a logic output, whereas NEMS type dual-rail dynamic logic gates generate both a logic output and its complementary output.

Before NEMS DRADL cascade circuit 132 starts normal operations, an initialization is necessary to charge one output to $V_{dd}$ and discharge the other output to ground. This ensures that one of the two switches S1 and S2 is on and the other one is off. FIG. 10 shows a simple solution for initialization. EN is the initialization enable signal.

In the following, in sake for clarity of the description, it is assumed that after applying a pre-determined input vector, the F side branch 132a is non-conducting and the side branch 132b is conducting. The output (out) is charged to $V_{dd}$ through a pull-up switch S3, so that switch S2 conducts. By connecting the power clock signal Φ to ground, the output is discharged to ground, and switch S1 is off to retain the charges stored on the output out capacitor.

Figure 11:
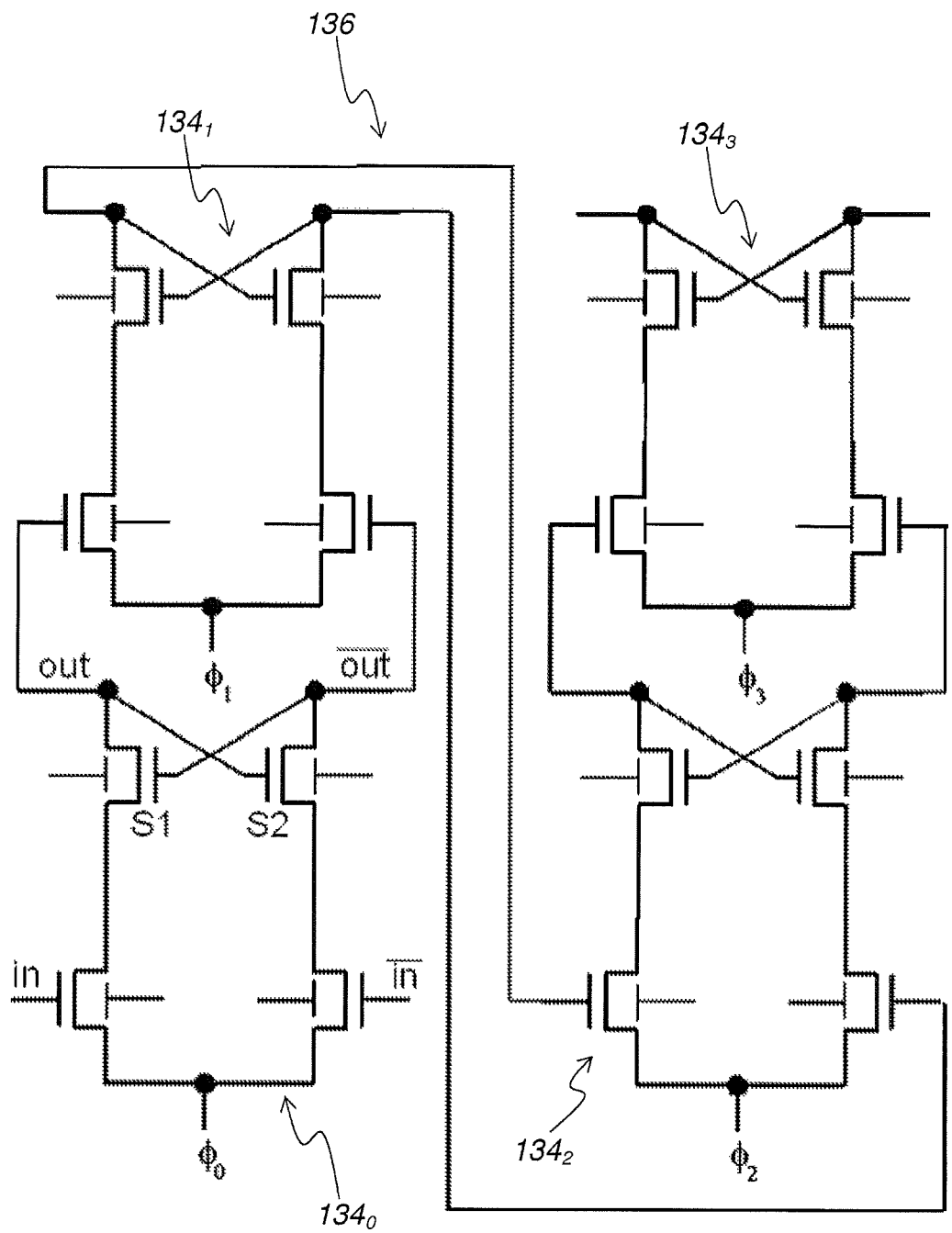
FIG. 11 shows schematically a four cascaded four terminal nano-electro-mechanical-switch dual rail adiabatic dynamic logic circuit.

To explain how to cascade NEMS DRADL, FIG. 11 shows a four cascaded NEMS DRADL inverters circuit 136 comprising four cascaded NEMS DRADL inverters circuits $134_0$, $134_1$, $134_2$, $134_3$, the outputs of one NEMS DRADL inverters circuits $134_0$, $134_1$, $134_2$, being connected to the inputs of the following NEMS DRADL inverters circuits $134_1$, $134_2$, $134_3$. Four phase power clocks $\Phi_0$, $\Phi_1$, $\Phi_2$, $\Phi_3$, as shown in FIG. 7, are used to ensure a correct functioning of the four cascaded NEMS DRADL inverters circuit 136.

In the following, it is assumed, as starting point, that output out is at $V_{dd}$ and output $\overline{out}$ is at ground, so NEMS S2 is on and NEMS S1 is off.

In the precharge interval, the clock power supply signal ramps from 0 to $V_{dd}$, and both the input signals $\overline{in}$ and $\overline{out}$ are high. Consequently output out is precharged since output $\overline{out}$ is supplied with the power clock signal. In the meanwhile, output out is kept at $V_{dd}$. During the hold interval, the power clock signal is at $V_{dd}$. Both outputs out and $\overline{out}$ capacitors are kept at $V_{dd}$. In each NEMS DRADL inverters circuits $134_1$, $134_2$, $134_3$, during the evaluation interval, the inputs are stable because the preceding NEMS DRADL inverters circuits $134_0$, $134_1$, $134_2$, enters into the latch interval, so the outputs are evaluated and energy is recovered.

When the outputs of the first NEMS DRADL inverter circuit $134_0$ is precharged, it does not affect the second NEMS DRADL inverter circuit $134_1$ output latch because switches S1 and S2 are in a positive feedback loop to retain output values; the DC hysteresis of NEMS also makes the outputs more stable, as NEMS does not change its on/off status unless its input voltage reaches the pull-in voltage.

Figure 12:
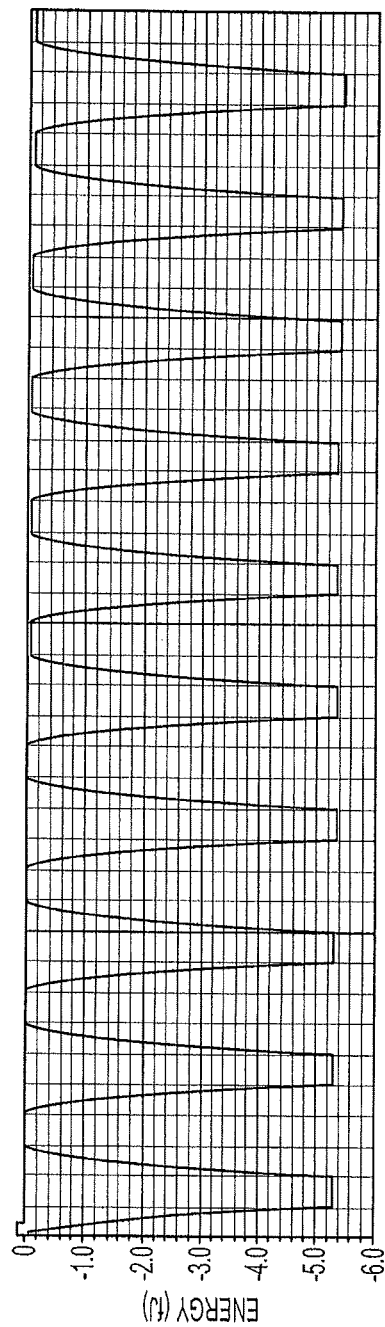
FIG. 12 shows graphically the energy dissipation in the circuit of FIG. 11.

The NEMS DRADL circuit 136 of FIG. 11 does not consume any non-adiabatic energy loss, except the NEMS contact energy loss. FIG. 12 illustrates the simulated energy consumption of NEMS DRADL circuit 136. As seen, NEMS DRADL circuit 136 consumes only marginal energy loss. Compared with conventional NEMS logic circuit (i.e. with a square wave clock power signal), the energy consumption is divided by more than one hundred when wiring load dominates total capacitive loadings.

The invention claimed is:

1. A dynamic logic gate, comprising:
   one or more four-terminal, nano-electro-mechanical-switches (NEMS);
   each NEMS having a body electrode, a source electrode, a gate electrode, and a drain electrode, the source electrode being selectively electrically connected to the drain electrode, as a function of tension between the gate electrode and the body electrode;
   wherein the body electrode of each NEMS is biased to a negative bias voltage ($V_b$) having an absolute value of min{$V_{po}$}, where $V_{po}$ is a set of varying pull-off voltages of all NEMS in the dynamic logic gate due to process variations, wherein a given pull-off voltage $V_{po}$ comprises an absolute value of an applied gate-to-body voltage |$V_{gb}$| that results in the source electrode from being electrically disconnected from the drain electrode, and such that an applied ground voltage (0V) to the gate electrode results in pull-off of any of the NEMS; and
   wherein a power supply voltage ($V_{dd}$) is set to a value corresponding to the expression: max{$V_{pi}$}−min{$V_{po}$}, where $V_{pi}$ is a set of varying pull-in voltages of all NEMS in the dynamic logic gate due to process variations, and wherein a given pull-in voltage $V_{pi}$ comprises an absolute value of an applied gate-to-body voltage |$V_{gb}$| that results in the source electrode from being electrically connected to the drain electrode.

2. The dynamic logic gate of claim 1, further comprising a time-varying power for supplying a timing-varying power clock signal to the nano-electro-mechanical-switch.

3. The dynamic logic gate of claim 2, wherein the time-varying power clock signal is one of a sinusoidal signal and a trapezoidal signal.

4. A dynamic logic cascade circuit comprising single-rail dynamic logic gates, comprising at least one dynamic logic gate according to claim 1, wherein the dynamic logic cascade circuit generates a single logic output.

5. The dynamic logic cascade circuit according to claim 4, comprising four dynamic logic gates coupled to four respective power sources for providing the four dynamic logic gates with respective time-varying power clock signals.

6. The dynamic logic cascade circuit according to claim 5, wherein the four power clock signals are out-of-phase by 90 degrees.

7. The dynamic logic cascade circuit according to claim 5, wherein each of the four time-varying power clock signals comprises four equal timing intervals, respectively corresponding to pre-charge, hold, evaluate and latch periods.

8. A dynamic logic cascade circuit comprising dual-rail dynamic logic gates, comprising at least one dynamic logic gate according to claim 1, wherein the dynamic logic cascade circuit generates a logic output and its complementary output.

9. A dynamic logic cascade circuit according to claim 8, comprising two cross-coupled dynamic logic gates for latching output signals.

10. A dynamic logic cascade circuit according to claim 8, further comprising a dynamic logic gate for initializing output signals.

11. A dynamic logic cascade circuit according to claim 8, comprising four dual-rails of dynamic logic gates and four respective power sources for providing the four dual-rails of dynamic logic gates with respective time-varying power clock signals.

* * * * *